(12) United States Patent
Chapelon

(10) Patent No.: US 8,907,481 B2
(45) Date of Patent: Dec. 9, 2014

(54) STACK OF SEMICONDUCTOR STRUCTURES AND CORRESPONDING MANUFACTURING METHOD

(71) Applicant: STMicroelectronics (Crolles 2) SAS, Crolles (FR)

(72) Inventor: Laurent-Luc Chapelon, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 13/869,072

(22) Filed: Apr. 24, 2013

(65) Prior Publication Data

US 2013/0292823 A1    Nov. 7, 2013

(30) Foreign Application Priority Data

May 7, 2012    (FR) ...................................... 12 54157

(51) Int. Cl.
| | | |
|---|---|---|
| *H01L 23/48* | (2006.01) | |
| *H01L 21/48* | (2006.01) | |
| *H01L 21/768* | (2006.01) | |
| *H01L 23/00* | (2006.01) | |
| *H01L 23/498* | (2006.01) | |
| *H01L 25/065* | (2006.01) | |
| *H01L 21/683* | (2006.01) | |
| *H01L 21/56* | (2006.01) | |

(52) U.S. Cl.
CPC . *H01L 23/49811* (2013.01); *H01L 2224/05181* (2013.01); *H01L 21/4853* (2013.01); *H01L 2224/13007* (2013.01); *H01L 2224/16146* (2013.01); *H01L 21/76898* (2013.01); *H01L 2224/80357* (2013.01); *H01L 2224/05647* (2013.01); *H01L 24/92* (2013.01); *H01L 2224/9202* (2013.01); *H01L 2224/9201* (2013.01); *H01L 24/11* (2013.01);

(Continued)

(58) Field of Classification Search
CPC ..................... H01L 21/4853; H01L 21/76898; H01L 23/481; H01L 23/49811
USPC .......... 257/697, 737, 738, 741, 778, E21.499, 257/E21.509, E23.011, E23.068; 438/108, 438/109, 613, 667
See application file for complete search history.

(56) References Cited

U.S. PATENT DOCUMENTS 6,239,495 B1 *   5/2001   Sakui et al. .................... 257/777
6,452,117 B2 *   9/2002   Curcio et al. .................. 174/262

(Continued)

OTHER PUBLICATIONS

INPI Preliminary Search Report and Written Opinion for FR 1254157 mailed Feb. 18, 2013 (13 pages).

(Continued)

*Primary Examiner* — Dao H Nguyen
(74) *Attorney, Agent, or Firm* — Gardere Wynne Sewell LLP

(57) ABSTRACT

A stack of a first and second semiconductor structures is formed. Each semiconductor structure includes: a semiconductor bulk, an overlying insulating layer with metal interconnection levels, and a first surface including a conductive area. The first surfaces of semiconductor structures face each other. A first interconnection pillar extends from the first surface of the first semiconductor structure. A housing opens into the first surface of the second semiconductor structure. The housing is configured to receive the first interconnection pillar. A second interconnection pillar protrudes from a second surface of the second semiconductor structure which is opposite the first surface. The second interconnection pillar is in electric contact with the first interconnection pillar.

19 Claims, 16 Drawing Sheets

(52) U.S. Cl.
CPC ... *H01L 21/6835* (2013.01); *H01L 2224/05166* (2013.01); *H01L 24/13* (2013.01); *H01L 2224/80896* (2013.01); *H01L 2224/81815* (2013.01); *H01L 2224/80895* (2013.01); *H01L 2221/68372* (2013.01); H01L 25/0657 (2013.01); *H01L 21/563* (2013.01); *H01L 2224/81141* (2013.01); *H01L 2224/11912* (2013.01); *H01L 2224/13025* (2013.01); *H01L 2224/17181* (2013.01); H01L 23/481 (2013.01); *H01L 2224/13082* (2013.01); *H01L 2224/05571* (2013.01); *H01L 2224/73204* (2013.01); *H01L 2221/68327* (2013.01); H01L 24/80 (2013.01); *H01L 2224/13147* (2013.01); *H01L 24/05* (2013.01); *H01L 2224/13005* (2013.01); H01L 24/81 (2013.01); *H01L 2224/05611* (2013.01); *H01L 21/568* (2013.01); *H01L 2224/80141* (2013.01); *H01L 2224/13111* (2013.01); *H01L 24/03* (2013.01)

USPC .......... 257/737; 257/697; 257/738; 257/741; 257/E21.499; 257/E21.509; 257/E23.011; 257/E23.068; 438/108; 438/109; 438/613; 438/667

(56) References Cited

U.S. PATENT DOCUMENTS

| | | | |
|---|---|---|---|
| 8,669,174 B2 * | 3/2014 | Wu et al. | 438/613 |
| 8,735,288 B2 * | 5/2014 | Itaya et al. | 438/667 |
| 2009/0051046 A1 | 2/2009 | Yamazaki et al. | |
| 2010/0155940 A1 | 6/2010 | Kawashita et al. | |
| 2010/0200992 A1 | 8/2010 | Purushothaman et al. | |
| 2011/0250720 A1 * | 10/2011 | Chauhan | 438/107 |

OTHER PUBLICATIONS

Chen K N et al: "Integration Schemes and Enabling Technologies for Three-Dimensional Integrated Circuits," IET Computers and Digital Techniques, vol. 5, No. 3, May 9, 2011, pp. 160-168.

* cited by examiner

STACK OF SEMICONDUCTOR STRUCTURES AND CORRESPONDING MANUFACTURING METHOD

PRIORITY CLAIM

This application claims priority from French Application for Patent No. 1254157 filed May 7, 2012, the disclosure of which is hereby incorporated by reference.

TECHNICAL FIELD

The present disclosure relates to the field of microelectronics, and more specifically to the field of "vertical" electric interconnection in a stack of semiconductor structures, such as dies and semiconductor wafers.

BACKGROUND

Three-dimensional or 3D integration comprises stacking electronic components by superposing dies and/or wafers on one another and by creating vertical electric connections between these components by using interconnection pillars and/or vias crossing the different die or wafer layers.

As illustrated in FIGS. 1 and 2, dies are generally series-manufactured on semi-conductor wafers based on silicon or the like, which are then sawn. More specifically, functional areas 15, 25 necessary to the implementation of the dedicated functions of dies 1, 2, are etched in a semiconductor bulk 10, 20 of the wafer. Functional areas 15, 25 are further connected to different metal interconnection levels 13, 23 formed within an insulating layer 11, 21 typically based on oxide or the like, formed on the upper surface of the wafer. Such different metal interconnection levels 13, 23 especially enable to transfer electric connections from functional areas 15, 25 to upper surface 110, 210 (or front surface) of insulating layer 11, 21 in expectation of a connection with other dies. The wafer can then be sawn to separate the different chips thus obtained.

According to a practice illustrated in FIGS. 1 to 4, the die stack may be of face-to-face type, that is, with front surfaces 110, 210 of two dies 1, 2 being arranged in front of each other. In this specific case, to form the vertical electric connection between a first and a second die 1, 2, it is current to provide, for each of dies 1, 2, interconnection pillars 14, 24. Each pillar 14, 24 extends from a conductive area or pad 130, 230 of front surface 110, 210 of die 1, 2 and protrudes from front surface 110, 210 of die 1, 2.

Conductive areas 130, 230, typically based on copper, aluminum, or the like, generally form what is called the last metal interconnection level of metal levels 13, 23 of the oxide layer of die 1, 2. Conductive areas 130, 230 are especially used as lands for the growth of interconnection pillars 14, 24. Further, each pillar 14, 24 may be topped with a dome 140 based on a tin silver alloy (Sn/Ag) intended to ease the soldering to another interconnection pillar or another connection area.

To vertically connect the two dies 1, 2, the free end of one of interconnection pillars 14 of first die 1 should thus be placed in contact with the free end of one of interconnection pillars 24 of second die 2, and an annealing should be performed to melt dome 140 and merge the two pillars 14, 24. The space left between front surfaces 110, 210 of the two dies 1, 2 may then be filled by deposition of a polymer resin 3 of epoxy type or the like, commonly called underfill. Finally, an encapsulation resin 4 is deposited to fully cover one of the dies, and especially first die 1.

Further, as illustrated in FIGS. 2 and 4, it is also possible to provide metallized interconnection holes 26 in second die 2. Such metallized interconnection holes 26, also called "vias" or TSVs ("Through Silicon Vias"), are electrically connected to metal interconnection levels 23 of second die 2 and open out on lower surface 211 (or rear surface) of this second die 2.

A metal redistribution layer 27 (or RDL) is generally deposited on rear surface 211 of the second die 2 in the form of metal tracks. Redistribution layer 27 is in contact with vias 26, and is used as a support for the growth of conductor pads 28 protruding from rear surface 211 of second die 2. Pads 28 especially create an electric connection with a support for example having different connection pitches, or simply enable to have directly accessible electrodes.

SUMMARY

The vertical interconnection solution discussed hereabove has the disadvantage of require an accurate alignment of the interconnection pillars of the two dies with one another, to obtain a correct vertical electric connection.

The manufacturing process may further be very long and expensive since it requires performing several operations to grow the different interconnection pillars on the front and rear surfaces of the dies. Further, such operations must be carried out in different controlled environments.

Further, in certain operating conditions, the coupling between vias and the redistribution layer may electrically affect the component characteristics.

A simpler, less expensive, and more robust vertical electric interconnection solution is thus needed.

In this context, a novel structure of semiconductor structure stack and a corresponding manufacturing method are disclosed hereinafter.

According to an aspect, the present invention thus provides a structure formed of a stack of at least one first semiconductor structure on a second semiconductor structure, the first and second structures each comprising: a semiconductor bulk covered with an insulating layer comprising metal interconnection levels; and a first surface comprising at least one conductive area forming the last metal interconnection level of said levels, said first surfaces of the first and second structures facing each other, and the last metal level of the first structure being electrically connected to the last metal level of the second structure, said structure further comprising: a first interconnection pillar connected to said conductive area of the first structure, and protruding from the first surface of the first structure; a housing crossing the entire thickness of the second structure, and containing all or part of the first pillar, the first interconnection pillar extending substantially into the semi-conductor bulk of the second structure; and a second interconnection pillar protruding from a second surface of the second structure, said second surface being opposite to the first surface, the second pillar being in electric contact with said first pillar.

Thus, the first pillar extends from the first face of the first structure, through all or a part of the thickness of the semi-conductor substrate of the second structure. This particular implementation avoids the need of implementing an additional step for aligning the pillars, and provides a more solid interconnection pillar extending through the structures.

Advantageously, the first structure may be an electronic die.

Advantageously, the second structure may be an electronic die or a semiconductor wafer.

Preferably, the second pillar is placed vertically above the first interconnection pillar, the first and second pillars forming a global pillar.

According to an embodiment: the first surfaces of the first and second structures are preferably in direct contact and form a single common insulating layer; and the first pillar preferably extends from one of the conductive areas of said single insulating layer, and is entirely positioned within the housing.

According to this embodiment: the last metal interconnection level of the first structure and the last metal interconnection level of the second structure may comprise a plurality of conductive areas; one at least of said conductive areas of the first structure may be topped with said first interconnection pillar; and each of said conductive areas of the first structure which does not contain said first pillar is preferably in direct contact with one of the conductive areas of the second structure.

For example, the ratio of the housing volume to that of the first pillar is greater than 4.

According to another embodiment: said conductive area of the second structure preferably delimits the opening of the housing towards the first surface of the second structure; the housing may comprise: an insulating layer following the shape of the internal walls of the housing, a conductive barrier layer covering said insulating layer and said conductive area delimiting the opening of the housing, and a volume of a conductive solder material; a fraction of the first pillar is preferably positioned in the housing, said volume of solder material filling the volume unoccupied by said first pillar in the housing; the assembly formed by the first pillar, the solder material, and the barrier layer lining the walls of the housing preferably ensuring the electric contact between the last metal levels of the first and second structures.

According to this other embodiment: the ratio of the volume of the housing to that of the first pillar is preferably greater than 2; and at least two thirds of the height of the first pillar is preferably positioned within the housing.

Advantageously, the structure first comprises an underfill filling the space between the first surfaces of the first and second structures.

According to another aspect, a method for manufacturing a stack of at least a first semiconductor structure on a second semiconductor structure, the first and second structures each comprising: a semiconductor bulk covered with an insulating layer comprising metal interconnection levels; and a first surface comprising at least one conductive area forming the last metal interconnection level of said levels, said first surfaces of the first and second structures facing each other, and the last metal level of the first structure being electrically connected to the last metal level of the second structure; the manufacturing method comprising the steps of: forming at least a first interconnection pillar extending from the conductive area of the first structure, and protruding from the first surface of the first structure; forming at least one housing open on the first surface of the second structure, crossing the entire thickness of the second insulating layer and part of the thickness of the semiconductor bulk of the second structure; and positioning all or part of the first pillar in said housing by placing the first surface of the first structure in front of the first surface of the second structure, and electrically connecting the last metal level of the first structure to that of the second structure, the first interconnection pillar extending substantially into the semi-conductor bulk of the second structure.

Advantageously, the method may further comprise the steps of: opening the housing towards the second surface of the second structure, said second surface being opposite to the first surface of the second structure; depositing a passivation layer on the second surface of the second structure; removing the passivation layer portion in front of the first interconnection pillar; depositing a conductive seed layer on the passivation layer, the seed layer being electrically connected to the first interconnection pillar; forming at least one second interconnection pillar extending from an area of the seed layer, and protruding from the second surface of the second structure; and partially removing the seed layer, the first and second pillars remaining electrically interconnected via the remaining seed layer.

Preferably, the second pillar is placed on a vertical line above the first interconnection pillar, the first and second pillars forming a global pillar.

According to an embodiment: the last metal interconnection level of the first structure may comprise a plurality of conductive areas, one at least of said conductive areas of the first structure being topped with said first interconnection pillar; the last metal interconnection level of the second structure may comprise a plurality of conductive areas; the step of positioning the first pillar and of connecting the last metal levels may comprise the steps of: positioning the first pillar entirely within the housing; and directly bonding under a controlled atmosphere each of the conductive areas of the first structure which does not contain the first pillar to one of the conductive areas of the second structure.

For example, the ratio of the volume of the housing to that of the first pillar is greater than 4.

According to another embodiment: the last metal interconnection level of the first structure may comprise a plurality of conductive areas, one at least of said conductive areas of the first structure being topped with said first pillar; the last metal interconnection level of the second structure may comprise a plurality of conductive areas, one at least of said conductive areas of the wafer delimiting the opening of the housing towards the first surface of the second structure; the method further comprising the steps of: conformally depositing an insulating layer on the internal walls of the housing, depositing a conductive barrier layer on said insulating layer and on the conductive area delimiting the opening of the housing; and partially filling the housing with a volume of a solder material.

Preferably, the step of positioning the first pillar and of connecting the last metal levels comprises the steps of: positioning a fraction of the first pillar within the housing; and soldifying the solder paste, said solder material filling the entire volume unoccupied by said first pillar in the housing; the assembly formed by the first pillar, the solder material, and the barrier layer preferably ensuring the electric contact between the last metal levels of the first and second structures.

Preferably, the ratio of the volume of the housing to that of the first pillar is greater than 2, and at least two thirds of the height of the first pillar is positioned within the housing.

Advantageously, the method further comprises the step of depositing an underfill capable of filling the space between the first surfaces of the first and second structures.

The foregoing and other objects, features, and advantages of the present invention will be discussed in detail in the following non-limiting description of specific embodiments in connection with the accompanying drawings.

BRIEF DESCRIPTION OF THE DRAWINGS

For clarity, the same elements are designated with the same reference numerals in the different drawings and the various drawings are not to scale.

DETAILED DESCRIPTION OF THE DRAWINGS

Figure 12:
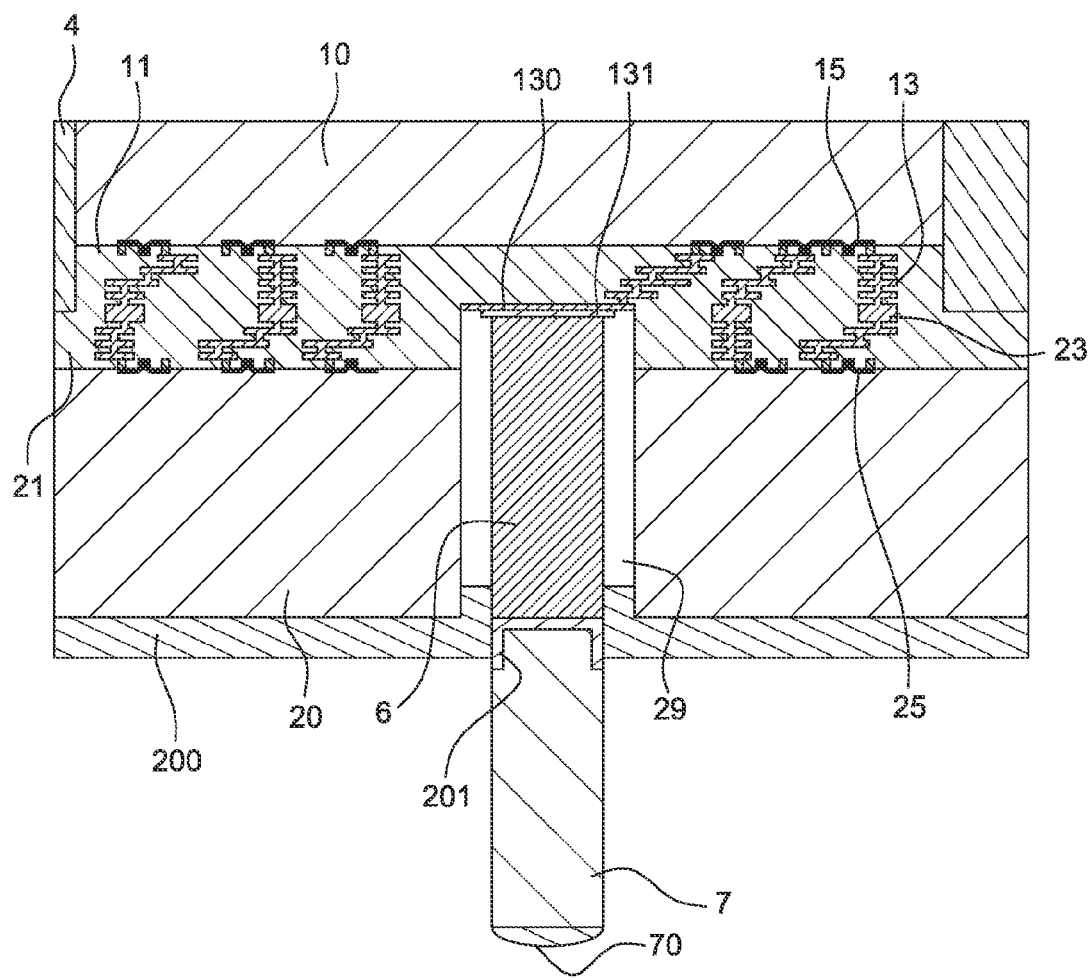
Figure 19:
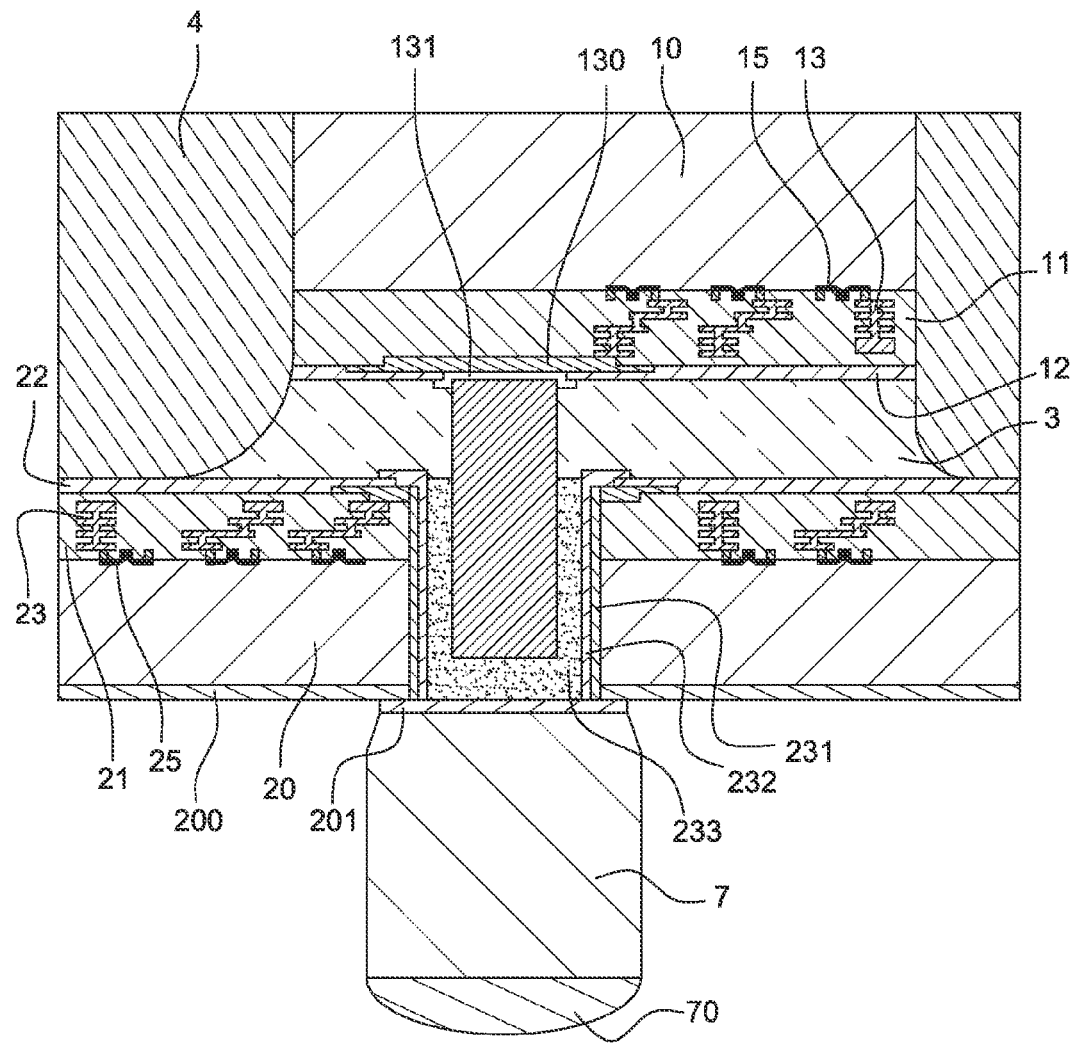

The stack structure according to different embodiments is disclosed in FIGS. 12 and 19, and is formed of a stack of at least a first semiconductor structure on a second semiconductor structure.

Each of the first and second structure may be a semiconductor wafer or an electronic die, and especially comprises: a semiconductor bulk covered with an insulating layer comprising metal interconnection levels; and a first surface comprising at least a conductive area forming the last metal interconnection level of these metal levels. The first surfaces of the first and second structures face each other and the last metal level of the first structure is electrically connected to the last metal level of the second structure.

The stack structure further comprises: a first interconnection pillar connected to the conductive area of the first structure, this first pillar protruding from the first surface of the first structure; a housing crossing the entire thickness of the second structure, and containing all or part of the first pillar; and a second interconnection pillar protruding from a second surface of the second structure, said second surface being opposite to the first surface, the second pillar being in electric contact with said first pillar.

Such a stack structure may be obtained by a manufacturing method which especially comprises: forming at least a first interconnection pillar extending from the conductive area of the first structure, and protruding from the first surface of the first structure; forming at least one housing open on the first surface of the second structure, crossing the entire thickness of the second insulating layer and part of the thickness of the second bulk; and positioning all or part of the first pillar within the housing by placing the first surface of the first structure in front of that of the wafer, and electrically connecting the last metal level of the first structure to that of the wafer.

The steps of this manufacturing method according to an embodiment are illustrated in FIGS. 5 to 12, and described hereinafter.

Figure 1:
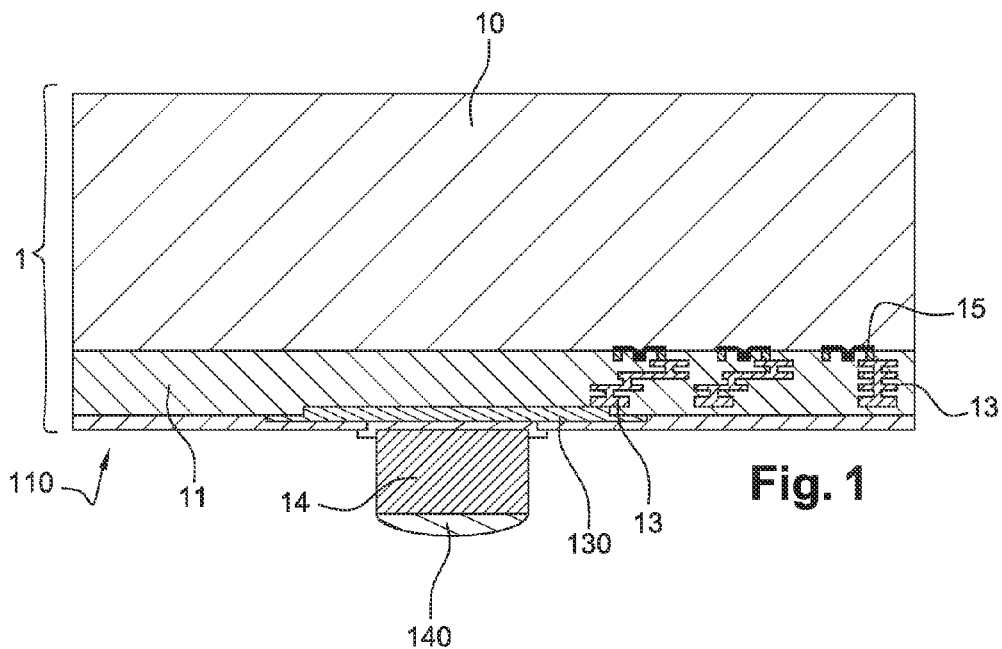
FIG. 1, previously described, is a partial cross-section view of a first die comprising an interconnection pillar according to an embodiment of prior art.
Figure 2:
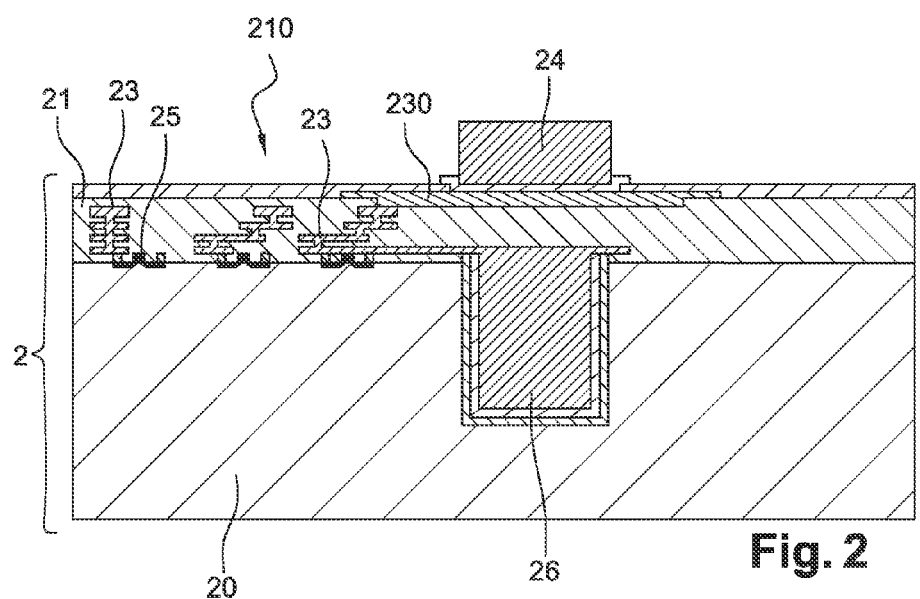
FIG. 2, previously described, is a partial cross-section view of a second die comprising an interconnection pillar intended to be soldered to the interconnection pillar of the first die of FIG. 1 according to an embodiment of prior art.
Figure 3:
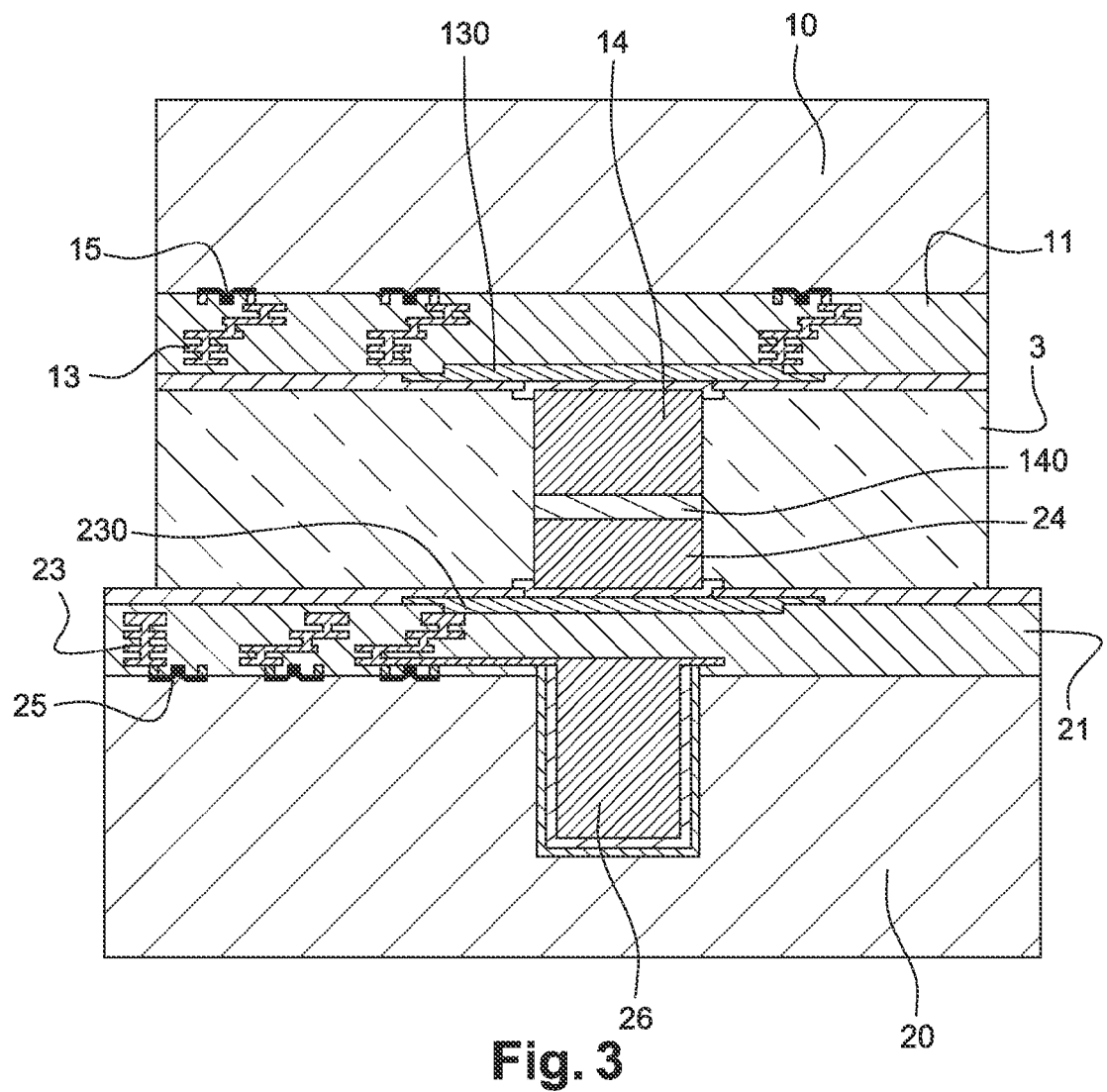
FIGS. 3 and 4, previously described, are cross-section views of the stack structure obtained after soldering of the interconnection pillars of the first and second dies of FIGS. 1 and 2, according to an embodiment of prior art.
Figure 4:
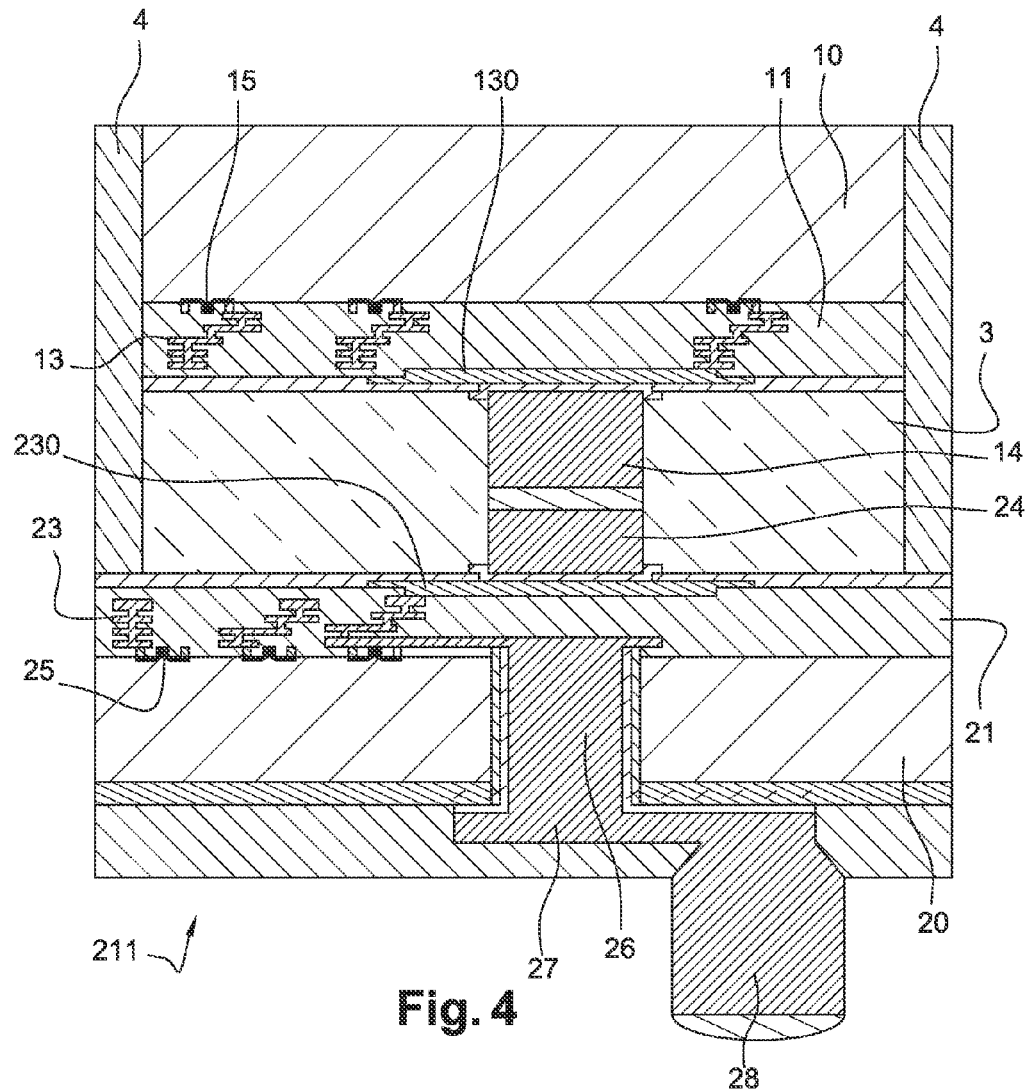
Figure 5:
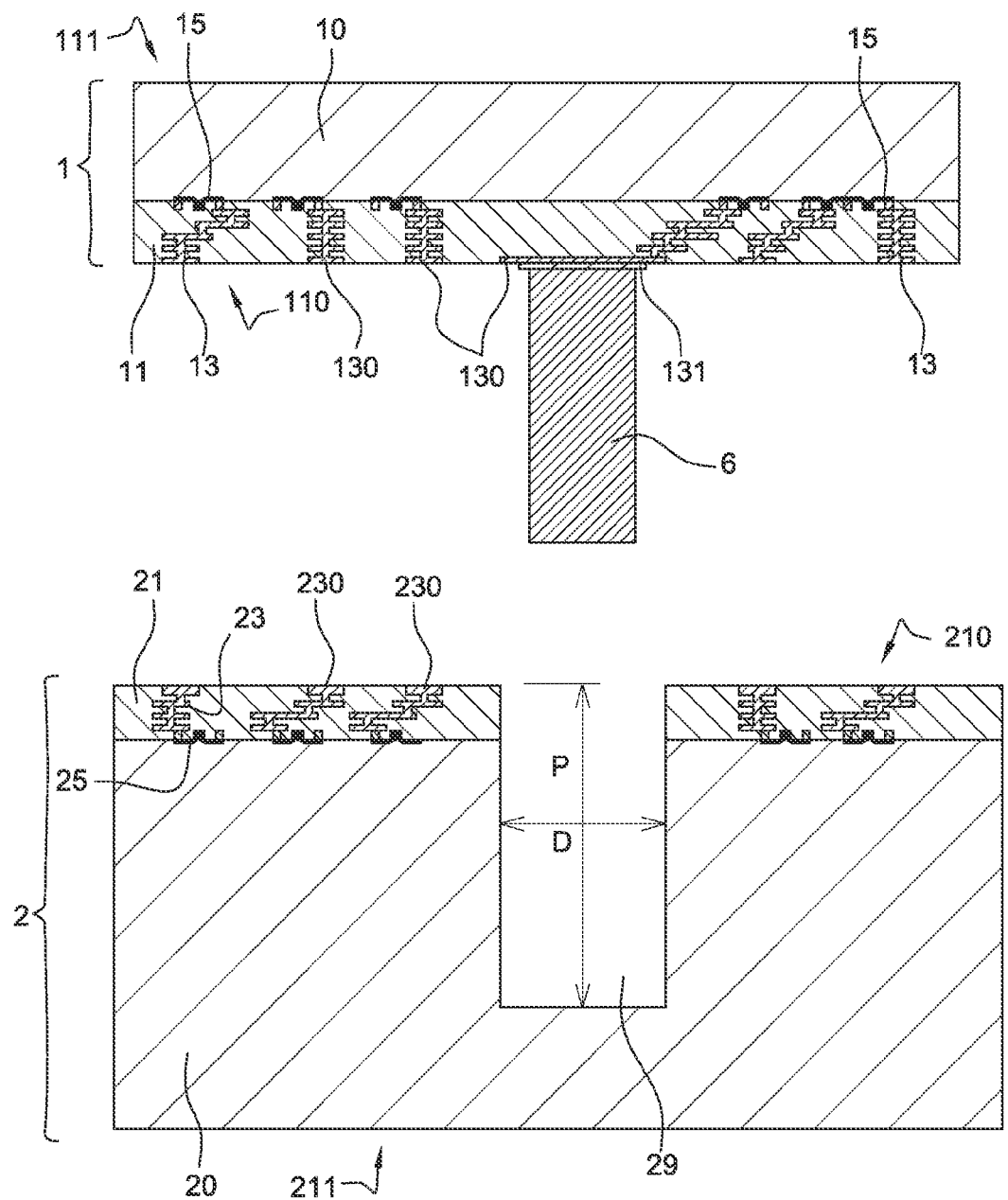
FIGS. 5 to 12 are partial cross-section views illustrating the different steps enabling to form the structure where two semiconductor structures are stacked according to an embodiment.

Portions of a first semiconductor structure 1 and of a second semiconductor structure 2 are especially shown in FIG. 5. These two structures are intended to be superposed to each other according to a face-to-face stack with a direct contacting. Each of first and second structures 1, 2 may be a semiconductor wafer or an electronic die.

First semiconductor structure 1 especially comprises: a first semiconductor bulk 10 which may comprise one or several functional areas 15 or integrated circuits; a first insulating layer 11, for example, based on oxide or the like, covering first bulk 10 and especially comprising metal interconnection levels 13; a first surface 110, forming the front surface of first semiconductor structure 1, comprising a plurality of conductive areas 130 of the last metal interconnection level of first structure 1; and a second surface 111, or rear surface, opposite to first surface 110.

Second semiconductor structure 2 especially comprises: a second semiconductor bulk 20 which may also comprise one or several functional areas 25 or integrated circuits; a second insulating layer 21, for example, based on oxide or the like, covering second bulk 20 and especially comprising metal interconnection levels 23; a first surface 210, forming the front surface of second semiconductor structure 2, also comprising a plurality of conductive areas 230 of the last metal interconnection level of second structure 2; and a second surface 211, or rear surface, opposite to first surface 210.

For each of first and second structures 1, 2, metal interconnection levels 13, 23 are stacked in the corresponding insulating layer 11, 21, and the last metal interconnection level is the level most remote from the corresponding bulk 10, 20. Further, each metal interconnection level may be formed of one or of several conductive elements parallel or substantially parallel to the front surface of the bulk, and of one or several vertical conductive elements perpendicular or substantially perpendicular to the front surface of the bulk. The conductive elements of these metal levels may be based on copper, aluminum, or the like and may have different dimensions.

To electrically connect all or part of the metal levels 13 of first structure 1 with all or part of metal levels 23 of second structure 2, one or several housings 29 are first formed across the thickness of second structure 2 (for clarity, a single housing has been shown in the drawings). At this stage, housing 29 is open on first surface 210 (or front surface) of second structure 2. Further, housing 29 extends across the entire thickness of second insulating layer 21 and through a fraction of the thickness of second bulk 20.

In practice, housing 29 is preferably formed by a deep etching method and is substantially cylindrical. Depth P of housing 29 is preferably smaller than 150 µm, for example, substantially equal to 100 µm. Its diameter D is preferably smaller than 140 µm, for example, substantially equal to 90 µm. In all cases, the size of the opening of housing 29 is preferably such that one of conductive areas 130 of first structure 1 can be contained within this opening.

Further, in practice, prior to the etching of the housing, it is possible to provide a step of polishing (for example, a chemical-mechanical polishing—CMP) of the first surface of the second structure to level and optimize the contact surface area.

Further, one or several interconnection pillars 6 are formed on first semiconductor structure 1 (a single interconnection pillar has been shown in the drawings for clarity). Each first pillar 6 extends from one of conductive areas 130 of structure 1, and protrudes from first surface 110 of first structure 1. First pillar 6 is made of a conductive material, for example, based on copper or the like.

In practice, it is also possible to provide a step of polishing of first surface 110 of first structure 1 to level and optimize the contact surface area.

A conductive barrier layer and a conductive seed layer (designated with reference numeral 131 in the drawings) may then be deposited on first surface 110. This deposition preferably is a "full plate" deposition and may be a chemical vapor deposition (CVD) or a physical vapor deposition (PVD). Barrier and seed layers 131 thus cover conductive area(s) 130 of the last metal level of first structure 1 and are thus electrically connected to metal interconnection levels 13 of first structure 1. The barrier layer is especially based on a conductive material capable of preventing the diffusion of copper particles into the bulk. This barrier layer may for example be based on tantalum, tantalum nitride, titanium, or titanium nitride. The seed layer promotes the growth of the pillar and may contain copper.

A resist mask (not shown in the drawings) may then be deposited on the barrier and seed layers. The resist mask is especially open above the conductive areas which are intended to receive the future first interconnection pillar(s).

Copper is then electrodeposited to form first interconnection pillars 29. Each interconnection pillar 29 thus extends from one of conductive areas 130 of first structure 1, and protrudes from said surface 110 of first structure 1. Preferably, first interconnection pillar 6 is substantially cylindrical and has a height smaller than 130 µm, for example, equal to 80 µm, and a diameter smaller than 100 µm, for example, substantially equal to 50 µm.

The resin layer, as well as barrier and seed layers 131 containing no first interconnection pillar 6, may then be removed.

Figure 6:
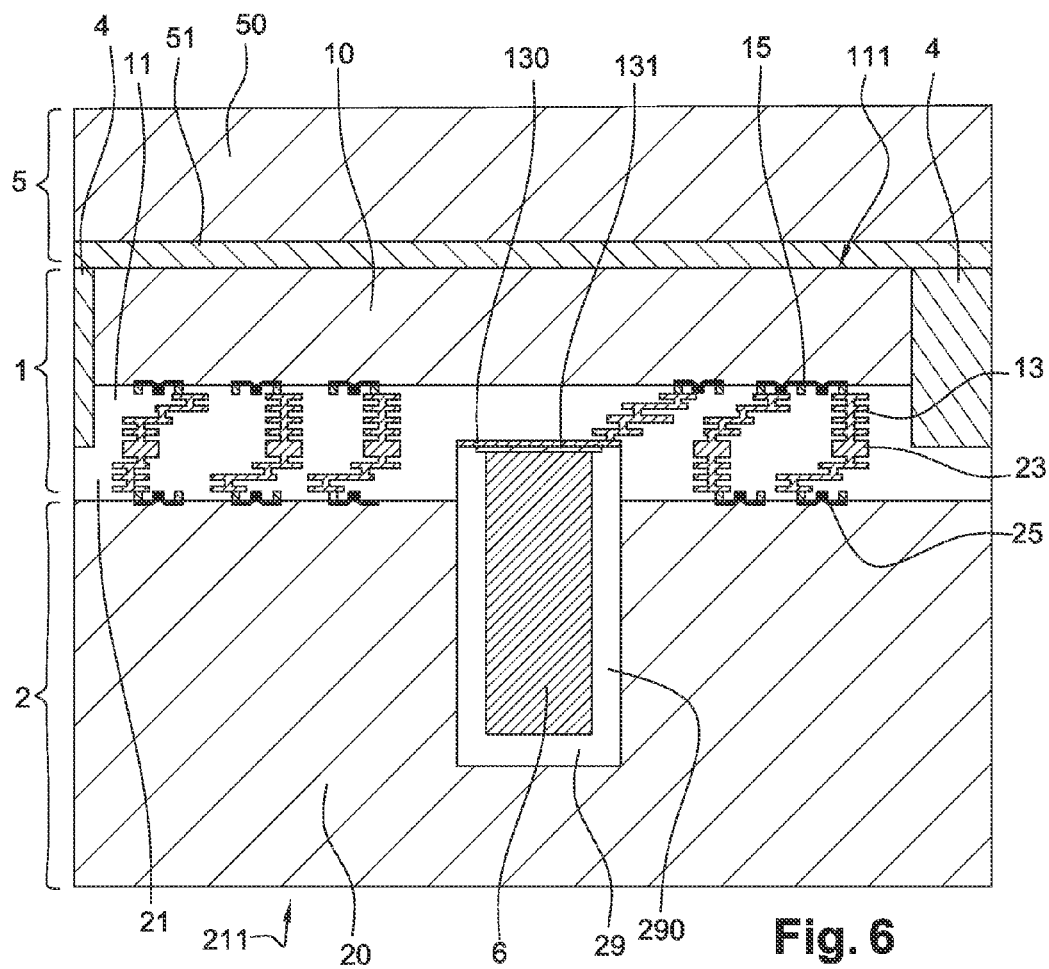

Once housings 29 and first interconnection pillars 6 have been formed, first surface 110 (or front surface) of first structure 1 is placed in contact with first surface (or front surface) 210 of second structure 2, especially by direct bonding, thus closing the opening of housing(s) 29 (FIG. 6). More specifically, each of the first interconnection pillars is arranged within one of housings 29, and conductive areas 130 of the last metal level of first structure 1 are placed in direct contact with conductive areas 230 of the last metal level of second structure 2. This direct bonding may be performed by means of an anneal at a 400° C. temperature, for example, which provides a strong bonding of conductive areas 130, 230 together. Thereby, first and second insulating layers 11, 21 now form one and the same insulating layer interposed between first and second bulks 10, 20.

As can be seen in FIGS. 6 to 12, the dimensions of housing 29 are such that there is a free volume 290, or spacing between first interconnection pillar 6 and the internal walls of housing 29. This free volume preferably is a vacuum.

In the case where first structure 1 is an electronic die, it is possible to provide depositing an encapsulation resin layer 4 on this die. Encapsulation resin 4 may especially contain epoxy or the like.

In a subsequent step, to be able to operate on second surface 211 (or rear surface) of second structure 2, a support member 5 may be temporarily rigidly attached to rear surface 111 of first structure 1. Support member 5 commonly called "handle" or "carrier", may be a bulk 50 made of a material capable of being used as a mechanical support, for example, based on silicon, glass, or the like. Further, support member 5 is temporarily rigidly connected to rear surface 111 of first structure 1 via an adhesive material layer 51, for example, made of polyimide. Bulk 50 of support member 5 may have a thickness greater than 725 µm, for example, substantially equal to 775 µm. Further, adhesive material layer 51 may have a thickness smaller than 100 µm, for example, substantially equal to 20 µm.

Similarly, prior to the bonding of support member 5, it is possible to provide a step of polishing of rear surface 111 of first structure 1, to thin down the thickness of first structure 1 and to level the surface intended to receive support member 5.

Figure 7:
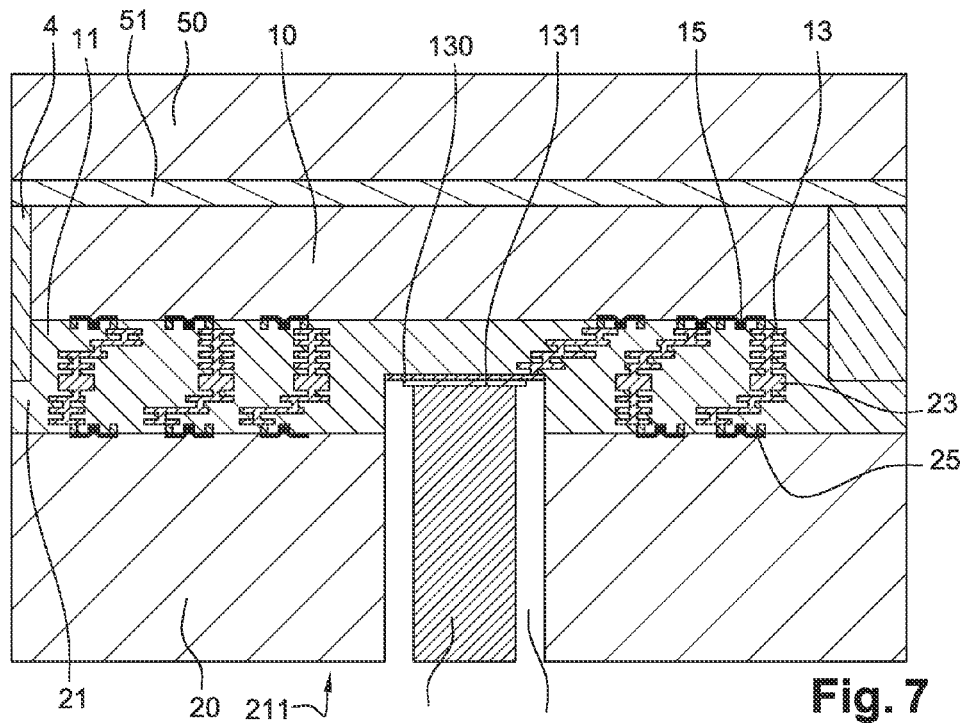
Figure 8:
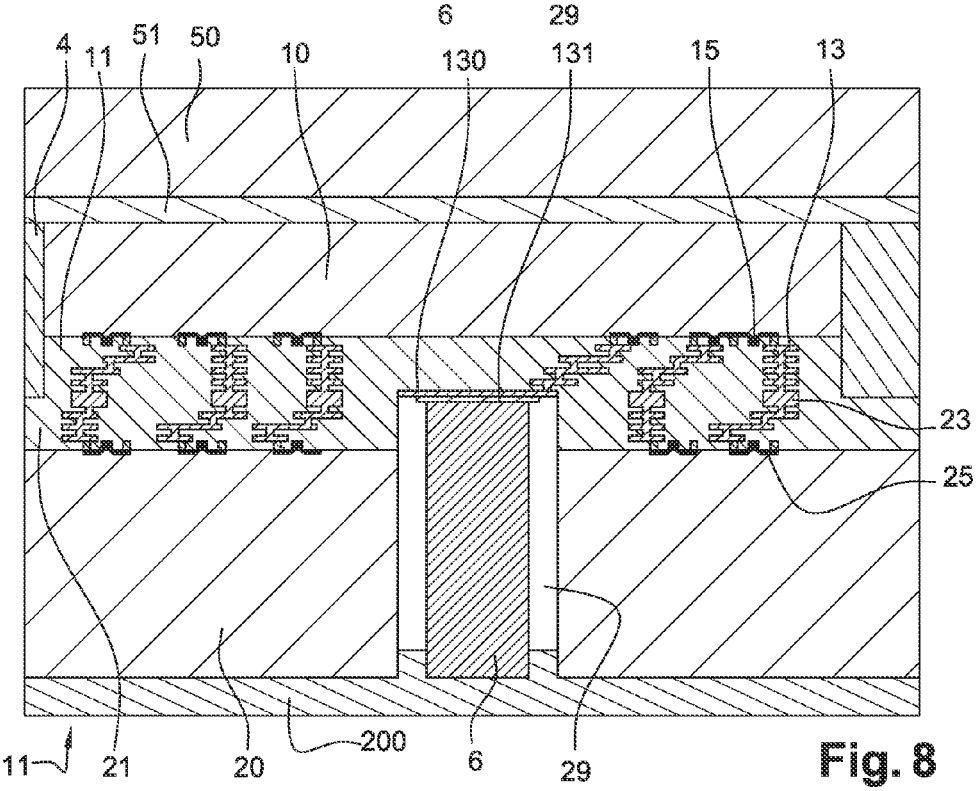
Figure 9:
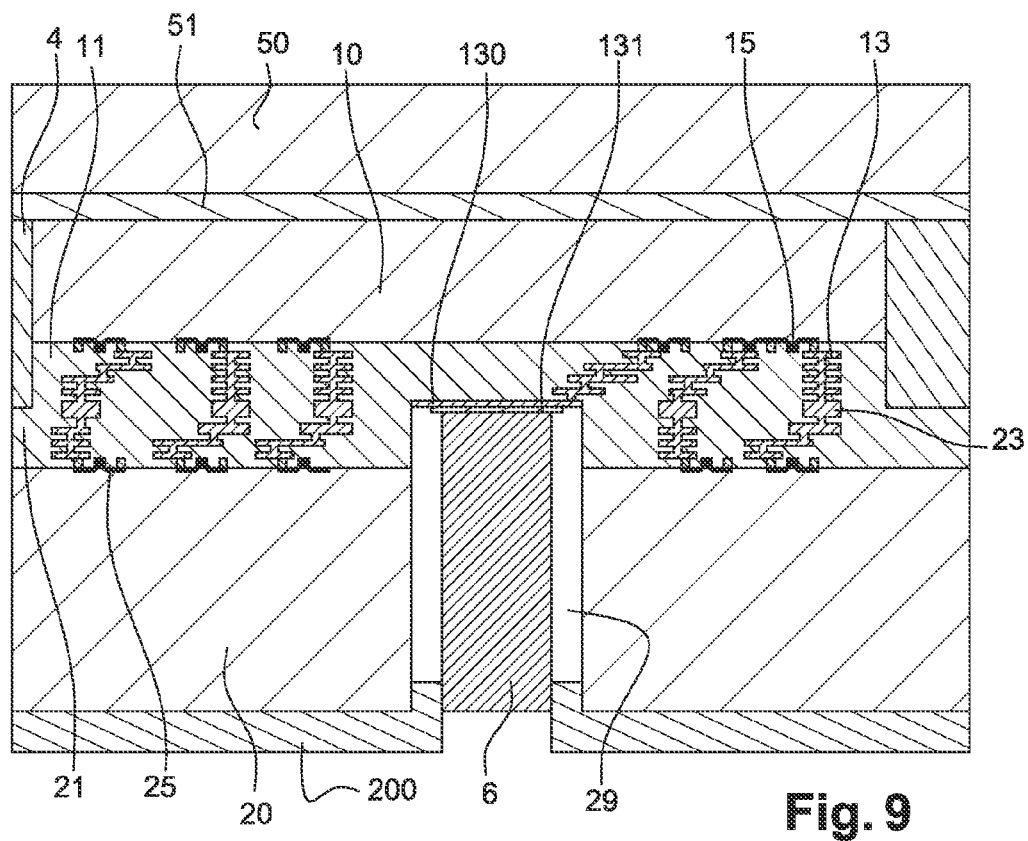
Figure 10:
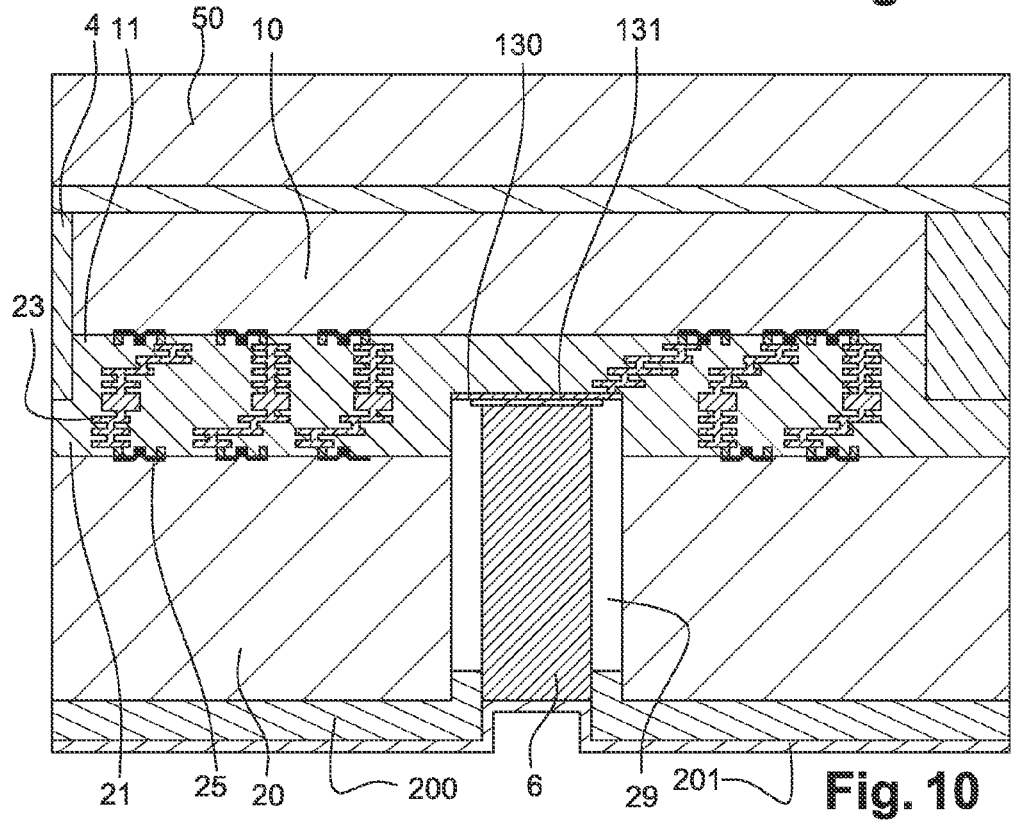
Figure 11:
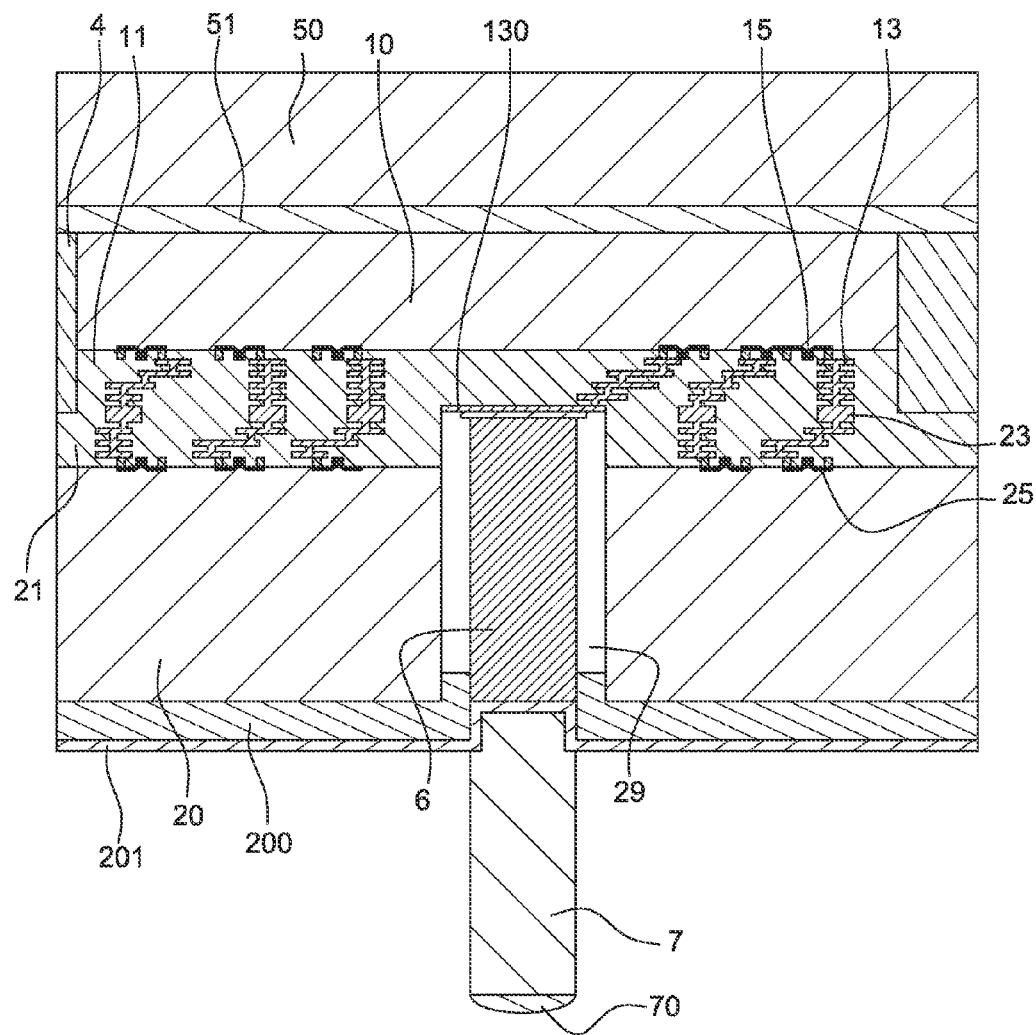

Once support member 5 has been bonded to rear surface 111 of first structure 1, each housing 29 is opened towards second surface (or rear surface) 211 of second structure 2 (FIG. 7). To achieve this, according to an embodiment, the following method may be implemented:

- first, a grinding, for example, starting with a large grain and continuing with a fine grain to thin down rear surface 211 of second structure 2;
- then, a chemical mechanical polishing (CMP) which enables to remove the possible hardened layer resulting from the grinding; in practice, at this stage, the CMP is performed to leave a thin layer of second bulk vertically above the pillar, for example, the thickness of this thin layer may be substantially equal to 10 µm;
- then, a dry etching selectively etches the material of the second bulk and opens housing 29 towards rear surface 211 of second structure 2; preferably, at this stage, the free end of first pillar 6 is substantially on the same plane as rear surface 211 of the second structure 2.

First interconnection pillar 6 being thus made exposed, a second interconnection pillar 7 protruding from rear surface 211 of second structure 2 is formed. Each second pillar 7 is further electrically connected to one of first interconnection pillars 6 (FIGS. 8 to 12).

To achieve this, an embodiment provides depositing (FIG. 8) a third insulating layer 200, typically, a photosensitive polymer (for example, SINR-3170 sold by equipment manufacturer Shin Etsu), on rear surface 211 of second structure 2. This deposition preferably is a full plate deposition, that is, it especially covers rear surface 211 of second structure 2 as well as the free end of first interconnection pillar 6. Advantageously, third insulating layer 200 enables to close housing 29 and thus to insulate first pillar 6. Preferably, this operation is performed in vacuum, so that free volume 290 contained in the housing after deposition of third insulating layer 200 is vacuum. Third insulating layer 200 may advantageously be deposited by spin coating. Openings are then formed (FIG. 9) in third insulating layer 200, and especially vertically above each first pillar 6 to expose the free end of each first interconnection pillar 6. Another conductive seed layer 201 is then deposited (FIG. 10) to cover third insulating layer 200 and the free end of each first interconnection pillar 6. Second interconnection pillar(s) 7 may then be formed (FIG. 11) on seed layer 201, for example, by electrolytic copper deposition. Such a copper deposition may then carry on with the deposition of a conductive material, typically made of an alloy based on tin/silver, in the form of a dome 70 after annealing.

Finally, as illustrated in FIG. 12, the seed layer portions which are not covered with a pillar are removed. Similarly, the support member is separated from the structure thus obtained, for example, by heating of the adhesive layer.

The stack structure thus obtained accordingly comprises:
- an insulating layer interposed between the first and second bulks, this insulating layer comprising metal interconnection levels electrically interconnecting the first and second bulks;
- one or several interconnection pillars extending from a conductive layer of one of the metal interconnection levels, crossing the entire thickness of second bulk 2, and protruding from the rear surface of this second bulk. In particular, each pillar results from the connection of a first pillar with a second pillar, the placing in contact of these two pillars then forming one and the same global connection pillar. Further, the pillar portion located outside of the second bulk is insulated therefrom by vacuum.

The steps of the manufacturing method according to another embodiment are illustrated in FIGS. 13 to 19, and described hereinafter.

Figure 13:
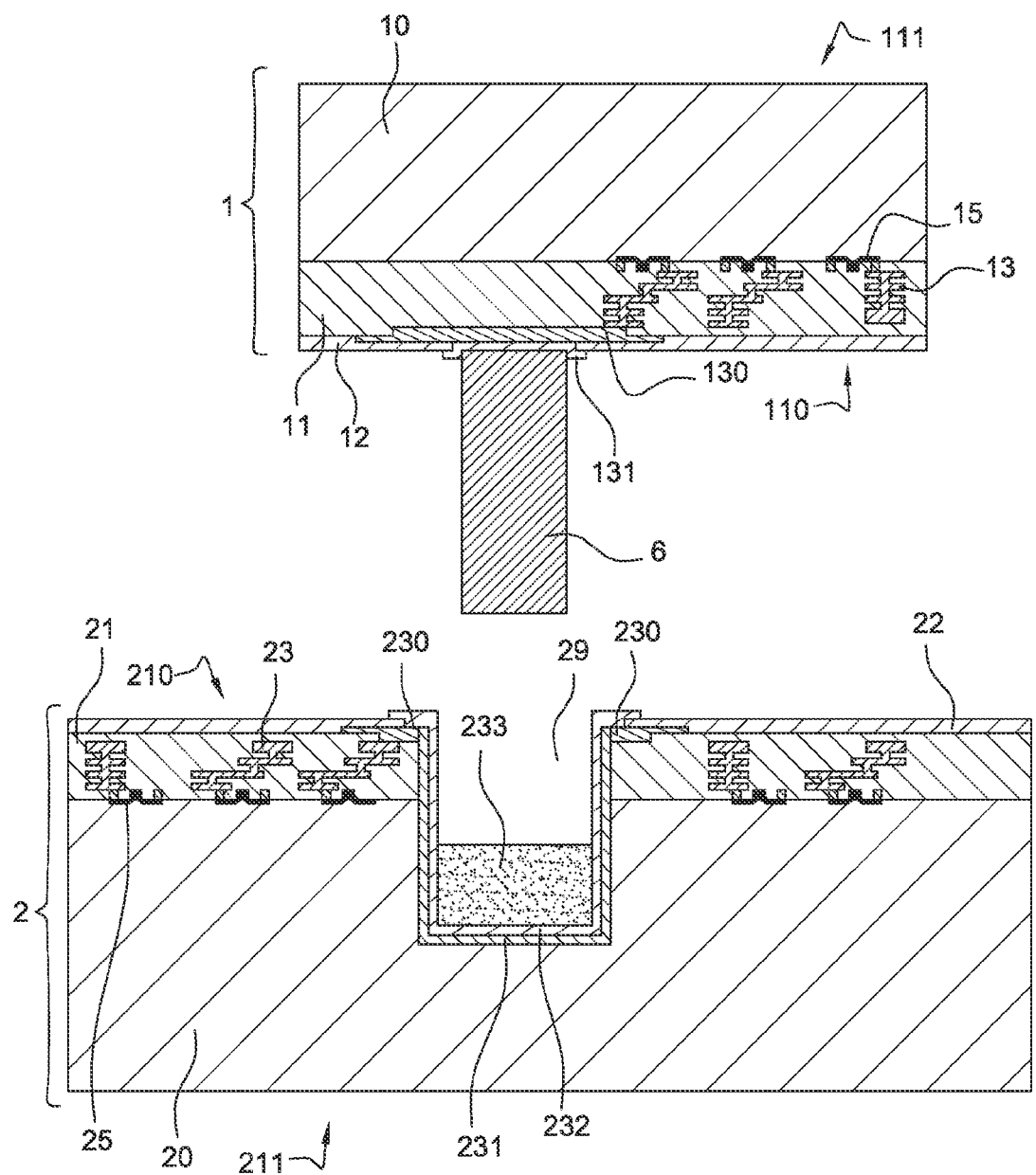
FIGS. 13 to 19 are partial cross-section views illustrating the different steps enabling to form the structure where two semiconductor structures are stacked, according to another embodiment.

For this other embodiment, portions of a first semiconductor structure 1 and of a second semiconductor structure 2 are especially shown in FIG. 13. These two structures are intended to be superposed to each other according to a face-to-face type stack with no direct bonding. Similarly, each of first and second structures 1, 2 may be a semiconductor wafer or an electronic die.

First semiconductor structure 1 especially comprises: a first semiconductor bulk 10 which may comprise one or several functional areas 15 or integrated circuits; a first insulating layer 11, for example, based on oxide or the like, covering first bulk 10 and especially comprising metal interconnection levels 13; a first surface 110, forming the front surface of first semiconductor structure 1, comprising a plurality of conductive areas 130 of the last metal interconnection level of first structure 1; and a second surface 111, or rear surface, opposite to first surface 110.

Further, in this other embodiment, the first surface (or front surface) of first structure 1 may be covered with a first passivation layer 12.

Second semiconductor structure 2 especially comprises: a second semiconductor bulk 20 which may also comprise one or several functional areas 25 or integrated circuits; a second insulating layer 21, for example, based on oxide or the like, covering second bulk 20 and especially comprising metal interconnection levels 23; a first surface 210, forming the front surface of second semiconductor structure 2, also comprising a plurality of conductive areas 230 of the last metal interconnection level of second structure 2; and a second surface 211, or rear surface, opposite to first surface 210.

Similarly, in this other embodiment, the first surface (or front surface) 210 of second structure 2 may be covered with a second passivation layer 22.

As in the embodiment discussed hereabove, it should be reminded that for each of first and second structures 1, 2, metal interconnection levels 13, 23 are stacked in the corresponding insulating layer 11, 21, and the last metal interconnection level is the level most remote from the corresponding bulk 1, 2. Further, each metal interconnection level 13, 23 may be formed of one or of several conductive elements parallel or substantially parallel to the front surface of the bulk, and of one or several vertical conductive elements perpendicular or substantially perpendicular to the front surface of the bulk. The conductive elements of these metal levels may be based on copper, aluminum, or the like and may have different dimensions.

In this other embodiment, one or several interconnection pillars 6 are also formed on first semiconductor structure 1 (a single interconnection pillar has been shown in the drawings for clarity). Each first pillar 6 extends from one of conductive areas 130 of structure 1, and protrudes from first surface 110 of first structure 1. First pillar 6 is made of a conductive material, for example, based on copper or the like.

In practice, the first passivation layer has open portions above the conductive areas which are intended to receive the future first interconnection pillar(s). A conductive barrier layer and a conductive seed layer (designated with reference numeral 131 in the drawings) may then be deposited on first surface 110. This deposition preferably is a "full plate" deposition and may be a chemical vapor deposition (CVD) or a physical vapor deposition (PVD). The barrier and seed layers thus cover all or part of conductive area(s) 130 of the last metal level of first structure 1 and are thus electrically connected to metal interconnection levels 13 of first structure 1. The barrier layer is especially based on a conductive material capable of preventing the diffusion of copper particles into the bulk. This barrier layer may for example be based on tantalum, tantalum nitride, titanium, or titanium nitride. The seed layer promotes the growth of the pillar and may contain copper. A resist mask (not shown in the drawings) may then be deposited on the barrier and seed layers. The resin mask is especially open above the conductive areas which are intended to receive the future first interconnection pillar(s). Copper is then electrodeposited to form first interconnection pillar(s) 6. Each first interconnection pillar 6 thus extends from one of conductive areas 130, and protrudes from first surface 110 of first structure 1. Preferably, first interconnection pillar 6 is substantially cylindrical and has a height smaller than 130 μm, for example, equal to 80 μm, and a diameter smaller than 100 μm, for example, substantially equal to 50 μm. The resin layer, as well as the barrier and seed layers containing no first interconnection pillar, may then be removed.

As for the previously-discussed embodiment, one or several housings 29 are also formed across the thickness of second structure 2 (for clarity, a single housing has been shown in the drawings). Advantageously, in this other embodiment, one of conductive areas 230 of second structure 2 delimits the opening of housing 29 towards first surface 210 of second structure 2. In other words, housing 29 especially extends across the entire thickness of second passivation layer 22, the entire thickness of a conductive area 230 of second structure 2, the entire thickness of second insulating layer 21, and through a fraction of the thickness of second bulk 20.

In practice, housing 29 is preferably formed by a deep etching method and is substantially cylindrical. The depth of housing 29 is preferably smaller than 100 μm, for example, substantially equal to 50 μm. Its diameter is preferably smaller than 140 μm, for example, substantially equal to 90 μm.

In this other embodiment, it is provided to partially fill housing 29 thus formed with a volume of a conductive solder material 233. To achieve this, an insulating layer 231 is first conformally deposited on the internal walls of housing 29. This insulating layer may be deposited as follows: a "full plate" deposition of the insulating layer is performed to cover the front surface of the second structure and to line the internal walls of the housing. The insulating layer portion lining the internal walls of the housing is then protected with a resist. The portions of the insulating layer unprotected by this resin are then removed by dry etching. Then, the resist is removed.

A conductive barrier layer 232 is then deposited on insulating layer 231 and on conductive layer 230 delimiting the opening of housing 29. Barrier layer 232 may especially be based on a conductive material capable of preventing the diffusion of copper particles into the bulk. Barrier layer 232 may for example be based on tantalum, tantalum nitride, titanium, or titanium nitride. Then, the housing is partially filled with a volume of conductive solder material 233, which is preferably in the form of a paste into which the first pillar is capable of penetrating. This solder paste may be based on a tin, silver, and copper alloy (SnAgCu).

Figure 14:
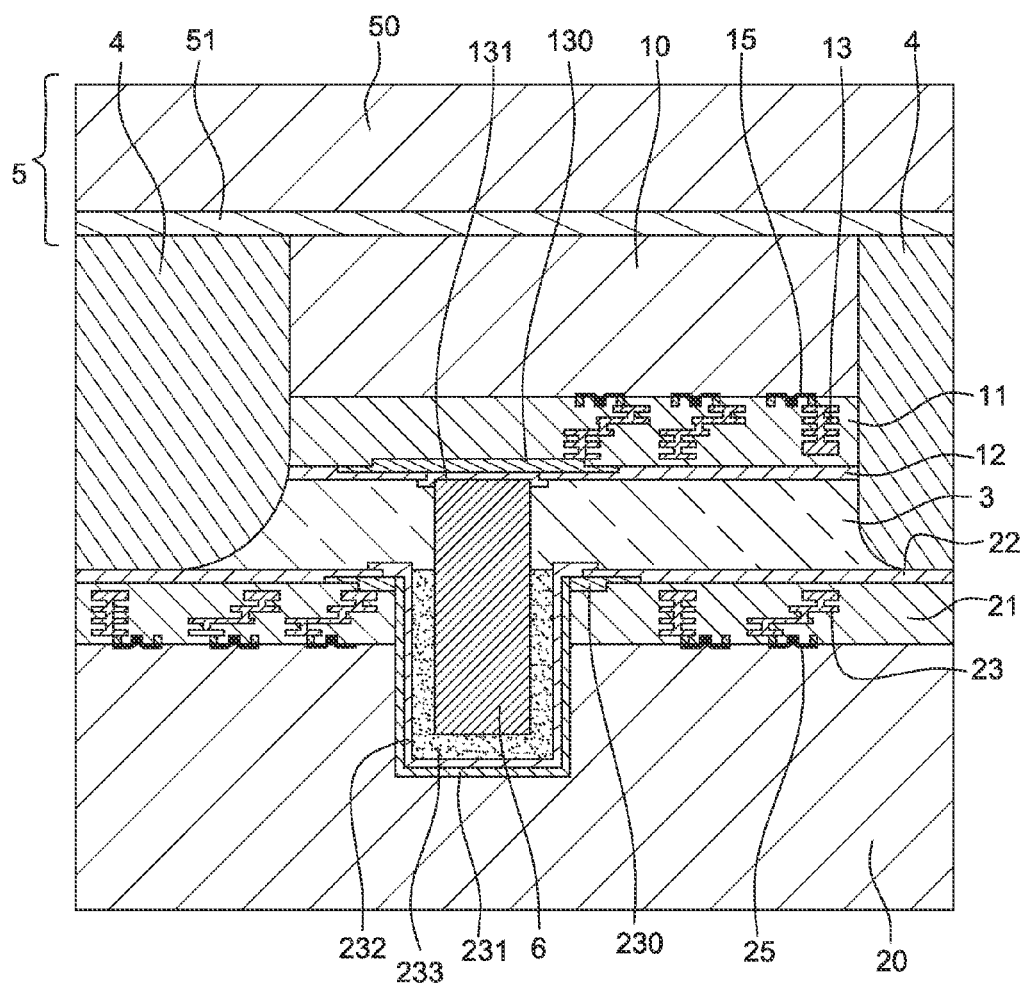

As illustrated in FIG. 14, a fraction of each first pillar 6 is then positioned in one of housings 29. In particular, the portion of first pillar 6 is made to penetrate into solder paste 233. At this stage, front surfaces 110, 210 of first and second structures 1, 2 face each other, but are not in direct contact. Advantageously, front surface 110 of first structure 1 is parallel or substantially parallel to front surface 210 of second structure 2. Solder paste 233 is then solidified, for example, by annealing, solder paste 233 after solidification preferably filling the entire volume unoccupied by the fraction of the first pillar in housing 29. Thus, the assembly formed by first interconnection pillar 6, solder paste 233, and barrier layer 232 ensures the electric contact between the last metal levels of first structure 1 and of second structure 2.

A coating resin 3 (commonly called underfill) is then deposited to fill the space between first surfaces 110, 210 of first structure 1 and of second structure 2. Underfill 3 may be a polymer resin of epoxy type or the like, and preferably has a thickness substantially equal to 30 µm.

Further, in the case where the first structure is a die, it is also possible to provide depositing an encapsulation resin 4 to totally cover the die. Encapsulation resin 4 may also contain epoxy or the like.

Similarly, to be able to operate on second surface 211 (or rear surface) of second structure 2, a support member 5 may be temporarily rigidly attached to rear surface 111 of first structure 1. Support member 5 commonly called "handle" or "carrier", may be a bulk 50 made of a material capable of being used as a mechanical support, for example, based on silicon, glass, or the like. Further, bulk 50 of support member 5 is temporarily rigidly connected to rear surface 111 of first structure 1 via an adhesive material layer 51, for example, made of polyimide.

As in the previous embodiment, prior to the bonding of support member 5, it is possible to provide a step of polishing of rear surface 111 of first structure 1, to thin down the thickness of first structure 1 and to level the surface intended to receive support member 5.

Once support member 5 has been bonded to rear surface 111 of first structure 1, second interconnection pillar(s) 7 are formed. Each second pillar 7 must especially be electrically connected to a first pillar 6 and protrude from rear surface 111 of second structure 2.

To achieve this, the following method may be implemented (FIGS. 15 to 18):

Second bulk 2 is first thinned down by grinding of its rear surface 211, for example, starting with a large grain and continuing with a fine grain, then with a chemical mechanical polishing (CMP) which enables to remove the possible hardened layer resulting from the grinding; in practice, at this stage, the thinning is performed to leave a thin layer of second bulk 2 vertically above the housing, for example, the thickness of this thin layer may be substantially equal to 10 µm.

Figure 15:
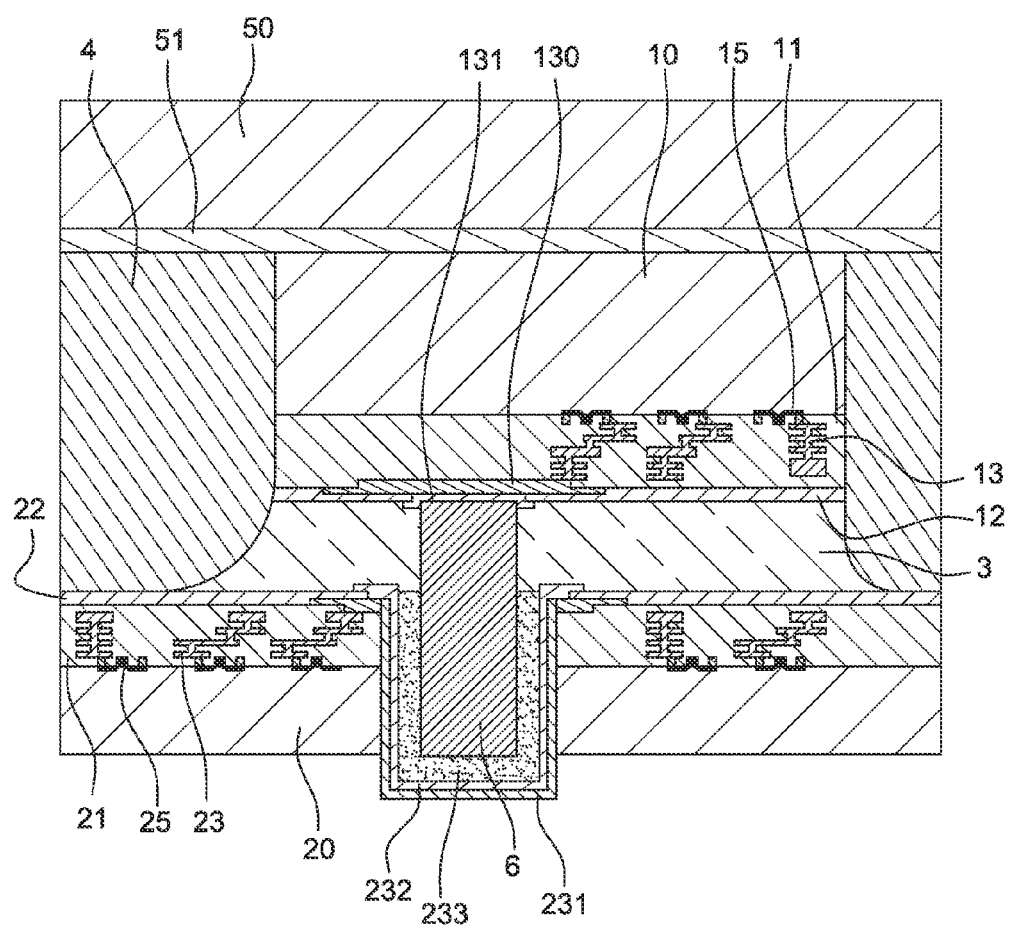
Figure 16:
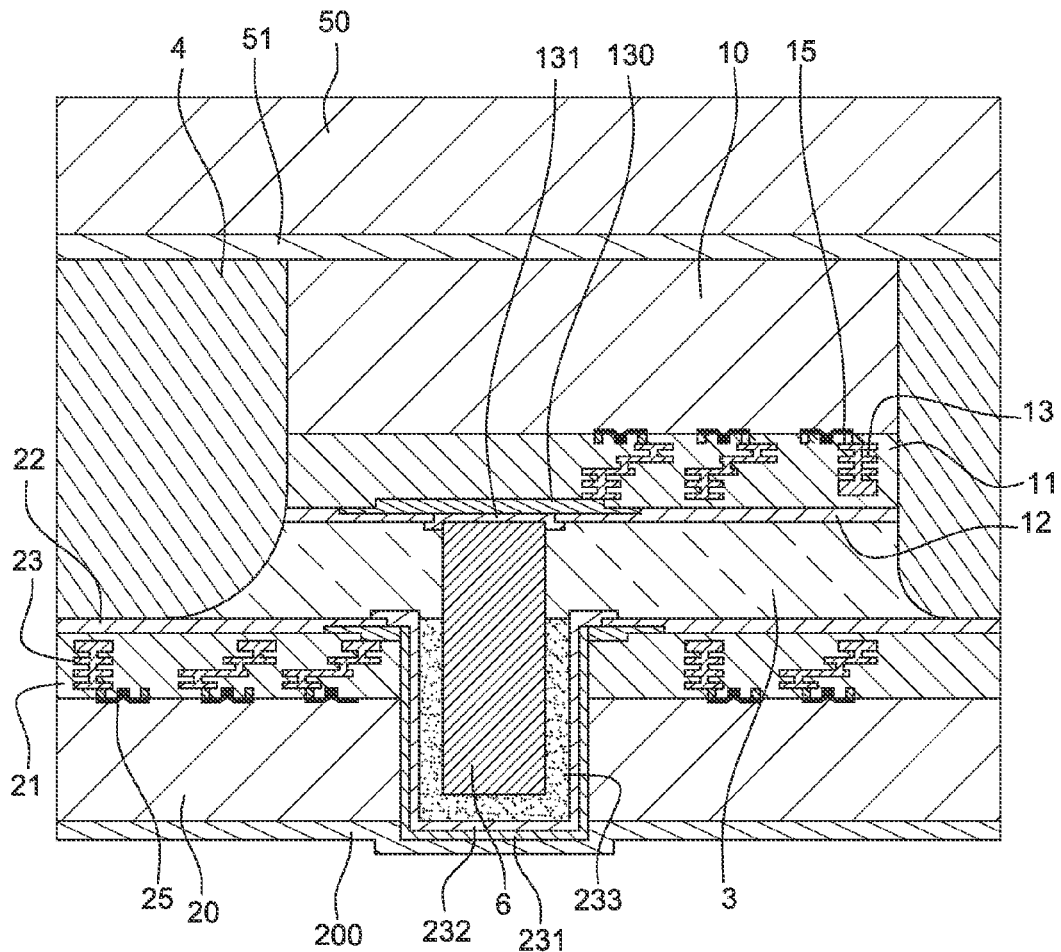
Figure 17:
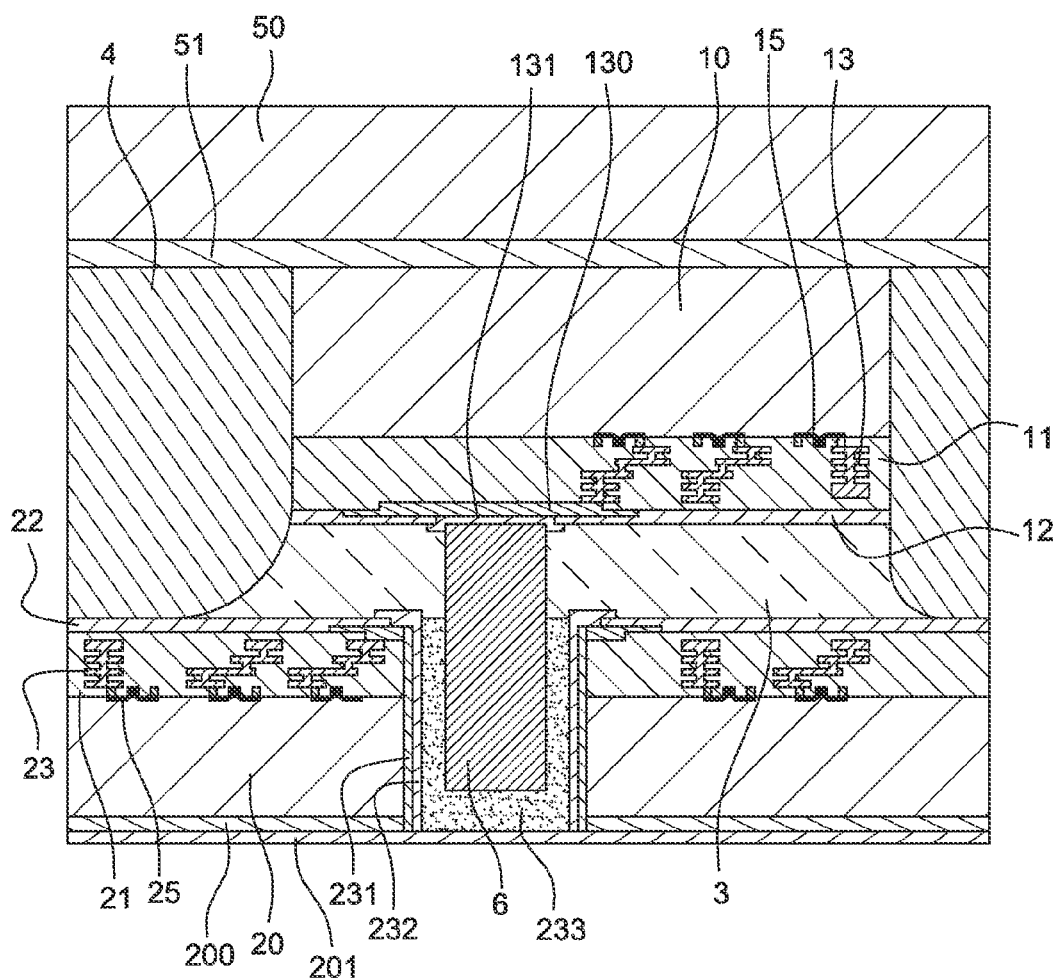
Figure 18:
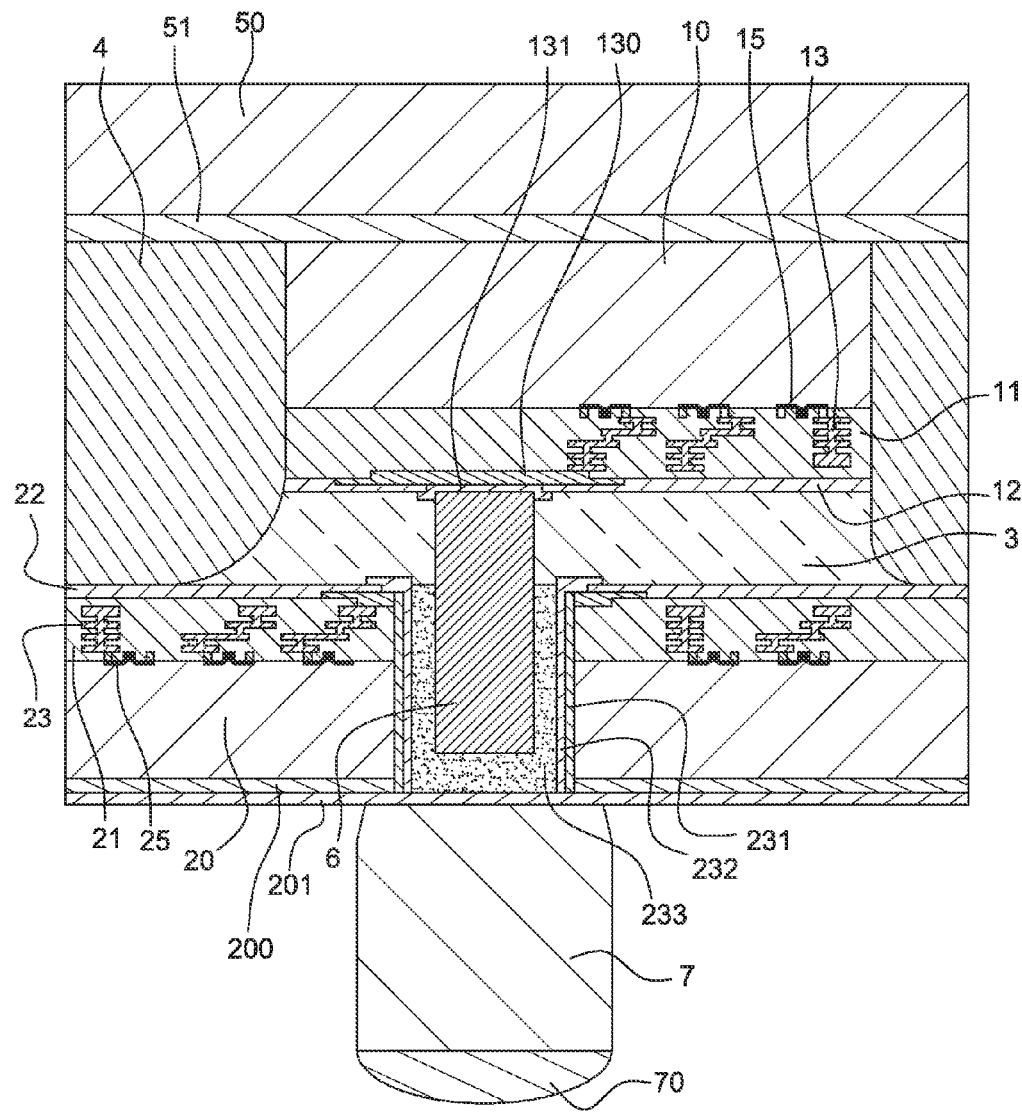

Then, as illustrated in FIG. 15, a selective etching, for example, a plasma etching, is performed to thin down second bulk 20 again without touching insulating layer 231 lining the walls of housing 29. In other words, a portion of housing 29 is exposed. In practice, the height of this portion may be substantially equal to 4 µm.

A silicon oxide layer 200 (FIG. 16) used as an insulating layer is then deposited full plate on rear surface 211 of second structure 2. This layer thus covers second bulk 20 and the exposed portion of housing 29. Another polishing is then performed to open housing 29. More specifically, rear surface 211 of second structure 2 is planed by chemical mechanical polishing. At this stage, insulating and barrier layers 231, 232 located on a vertical line above first pillar 6 are removed.

New conductive barrier and seed layers (designated with reference numeral 201) are then deposited to cover rear surface 211 of second structure 2 as well as housing 29.

Second interconnection pillar(s) 7 may then be formed (FIG. 18) on this new seed layer 201, for example, by copper electrodeposition. Such a copper deposition may then carry on with the deposition of a conductive material, typically made of an alloy based on tin/silver, in the form of a dome 70 after annealing.

Finally, as illustrated in FIG. 19, the barrier and seed layer portions which are not covered with a second pillar 7 are removed. Similarly, support member 5 is separated from the structure thus obtained, for example, by heating of adhesive layer 51.

In the end, the stack structure obtained by this other embodiment especially comprises one or several interconnection pillar(s), each pillar extending from a conductive area of the last metal interconnection level of the first structure. Each pillar crosses the entire thickness of second bulk 2, and protrudes from rear surface 211 of second bulk 2. In particular, each pillar results from the connection of a first pillar 6 to a second pillar 7, the placing into contact of these two pillars then forming one single global connection pillar.

Further, the assembly formed by the first pillar, the solder paste, and the barrier layer ensures the electric contact between the last metal levels of the first and second structures.

Although the foregoing description only discloses a stack of a semiconductor structure on a second semiconductor structure, the solution developed hereabove may also be implemented for the stacking of a plurality of first semiconductor structures, for example, electronic dies. The obtained stack structure may be sawn to obtain 3D electronic modules.

The 3D integration solution discussed hereabove provides, in a simple and less expensive manner, a stack of semiconductor structures such as die-to-wafer, die-to-die, or wafer-to-wafer structures. The vertical electric connection is ensured by interconnection pillars having the specificity of extending, from one of the metal interconnection levels of one of the structures, through the entire thickness of the other bulk to protrude from the rear surface of this other structure.

This type of interconnection pillar is thus firmly anchored in the stack, due to a direct face-to-face bonding or due to the combination of the solder paste and of the underfill layer.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A structure, comprising:
    a stack of at least a first semiconductor structure on a second semiconductor structure;
    wherein each of the first and second semiconductor structures comprises:
        a semiconductor bulk covered with an insulating layer comprising metal interconnection levels; and
        a first surface comprising at least one conductive area forming a last one of the metal interconnection levels, wherein the first surfaces of the first and second semiconductor structures face each other, and the last metal interconnection level of the first semiconductor structure is electrically connected to the last metal interconnection level of the second semiconductor structure;
    a first interconnection pillar connected to said conductive area of the first semiconductor structure and protruding from the first surface of the first semiconductor structure;
    a housing passing through an entire thickness of the second semiconductor structure which receives all or part of the first interconnection pillar, said first interconnection pillar extending substantially into the semiconductor bulk of the second semiconductor structure; and a second interconnection pillar protruding from a second surface of the second semiconductor structure, said second surface opposite to the first surface, the second interconnection pillar in electric contact with said first interconnection pillar.

2. The structure of claim 1, wherein the first semiconductor structure is an electronic die.

3. The structure of claim 1, wherein the second semiconductor structure is one of an electronic die or a semiconductor wafer.

4. The structure of claim 1, wherein the second interconnection pillar is located on a vertical line above the first interconnection pillar, the first and second interconnection pillars forming a global pillar.

5. The structure of claim 1, wherein:
the first surfaces of the first and second semiconductor structures are in direct contact and form a single common insulating layer;
the first interconnection pillar extends from one of the conductive areas of said single insulating layer, and is positioned entirely within the housing.

6. The structure of claim 5, wherein:
the last metal interconnection level of the first semiconductor structure and the last metal interconnection level of the second semiconductor structure comprise a plurality of conductive areas;
at least one of said conductive areas of the first semiconductor structure is topped with said first interconnection pillar; and
each of said conductive areas of the first semiconductor structure which does not contain said first interconnection pillar is in direct contact with one of the conductive areas of the second semiconductor structure.

7. The structure of claim 5, wherein a ratio of a volume of the housing to a volume of the first interconnection pillar is greater than 4.

8. The structure of claim 1, wherein:
said conductive area of the second semiconductor structure delimits an opening of the housing towards the first surface of the second semiconductor structure;
the housing comprises:
an insulating layer following the shape of internal walls of the housing,
a conductive barrier layer covering said insulating layer and said conductive layer delimiting the opening of the housing, and
a volume of a conductive solder material;
a fraction of the first interconnection pillar is positioned within the housing, said solder material volume filling the volume unoccupied by said first interconnection pillar in the housing;
the assembly formed by the first interconnection pillar, the solder material, and the barrier layer lining the walls of the housing ensuring the electric contact between the last metal levels of the first and second semiconductor structures.

9. The structure of claim 8, wherein:
the ratio of the volume of the housing to that of the first interconnection pillar is preferably greater than 2; and
at least two thirds of the height of the first interconnection pillar is positioned within the housing.

10. The structure of claim 8, further comprising an underfill filling the space between the first surfaces of the first and second semiconductor structures.

11. A method for manufacturing a stack of at least a first semiconductor structure on a second semiconductor structure,
wherein each of the first and second semiconductor structures comprises:
a semiconductor bulk covered with an insulating layer comprising metal interconnection levels; and
a first surface comprising at least one conductive area forming a last one of the metal interconnection levels, said first surfaces of the first and second semiconductor structures facing each other, and the last metal interconnection level of the first structure being electrically connected to the last metal interconnection level of the second semiconductor structure;
comprising the steps of:
forming at least a first interconnection pillar extending from the conductive area of the first semiconductor structure and protruding from the first surface of the first semiconductor structure;
forming at least one housing open on the first surface of the second semiconductor structure and passing through the entire thickness of the insulating layer and semiconductor bulk of the second semiconductor structure; and
positioning all or part of the first interconnection pillar in said housing by placing the first surface of the first semiconductor structure in front of the first surface of the second semiconductor structure and electrically connecting the last metal interconnection level of the first semiconductor structure to the last interconnection level of the second semiconductor structure, said first interconnection pillar extending into the semiconductor bulk of the second semiconductor structure.

12. The method of claim 11, further comprising:
opening the housing towards the second surface of the second semiconductor structure, said second surface being opposite to the first surface of the second semiconductor structure;
depositing a passivation layer on the second surface of the second semiconductor structure;
removing the passivation layer portion in front of the first interconnection pillar;
depositing a conductive seed layer on the passivation layer, the seed layer being electrically connected to the first interconnection pillar;
forming at least a second interconnection pillar extending from an area of the seed layer, and protruding from the second surface of the second semiconductor structure; and
partially removing the seed layer, the first and second interconnection pillars remaining electrically interconnected via the remaining seed layer.

13. The method of claim 11, wherein the second interconnection pillar is located on a vertical line above the first interconnection pillar, the first and second interconnection pillars forming a global pillar.

14. The method of claim 11, wherein:
the last metal interconnection level of the first semiconductor structure comprises a plurality of conductive areas, at least one of said conductive areas of the first semiconductor structure being topped with said first interconnection pillar;
the last metal interconnection level of the second semiconductor structure comprising a plurality of conductive areas; and the step of positioning the first interconnection pillar and the step of connecting the last metal interconnection levels comprises the steps of:
  positioning the first interconnection pillar entirely within the housing; and
  directly bonding under a controlled atmosphere each of the conductive areas of the first semiconductor structure which does not contain the first interconnection pillar to one of the conductive areas of the second semiconductor structure.

15. The method of claim 14, wherein a ratio of a volume of the housing to a volume of the first interconnection pillar is greater than 4.

16. The method of claim 11, wherein:
  the last metal interconnection level of the first semiconductor structure comprises a plurality of conductive areas, at least one of said conductive areas of the first semiconductor structure being topped with said first interconnection pillar;
  the last metal interconnection level of the second semiconductor structure comprises a plurality of conductive areas, at least one of said conductive areas delimiting the opening of the housing towards the first surface of the second semiconductor structure; and
  wherein the method further comprises the steps of:
    conformally depositing an insulating layer on internal walls of the housing,
    depositing a conductive barrier layer on said insulating layer and on the conductive area delimiting the opening of the housing; and
    partially filling the housing with a volume of a solder material.

17. The method of claim 16, wherein the step of positioning the first interconnection pillar and the step of connecting the last metal interconnection levels comprises the steps of:
  positioning a fraction of the first interconnection pillar within the housing; and
  soldifying the solder material, said solidified solder material filling the entire volume unoccupied by said first interconnection pillar in the housing;
  the assembly formed by the first interconnection pillar, the solder material, and the barrier layer ensuring the electric contact between the last metal levels of the first and second semiconductor structures.

18. The method of claim 17, wherein:
  the ratio of a volume of the housing to a volume of the first interconnection pillar is preferably greater than 2; and
  at least two thirds of a height of the first interconnection pillar is positioned within the housing.

19. The method of claim 17, further comprising depositing an underfill capable of filling the space between the first surfaces of the first and second semiconductor structures.

* * * * *